United States Patent [19]

Terado

[11] Patent Number: 5,115,154
[45] Date of Patent: May 19, 1992

[54] FREQUENCY AND/OR PHASE CHARACTERISTIC CONTROL CIRCUIT HAVING CONTROLLED CURRENT MULTIPLYING RATIO

[75] Inventor: Ikuo Terado, Kanagawa, Japan

[73] Assignee: Sony Corporation, Tokyo, Japan

[21] Appl. No.: 651,609

[22] Filed: Feb. 6, 1991

[30] Foreign Application Priority Data

Feb. 9, 1990 [JP] Japan ............................ 2-8372

[51] Int. Cl.⁵ .............................................. H03G 1/00
[52] U.S. Cl. ................................. 307/494; 307/511; 358/337; 358/227
[58] Field of Search ............... 307/494, 510, 511, 527, 307/529, 555; 328/155, 158; 358/225, 227, 320, 322, 337; 381/97

[56] References Cited

U.S. PATENT DOCUMENTS 4,010,424  3/1977  Faulkner ...................... 307/529 X
4,890,065  12/1989  Laletin ......................... 328/127 X

FOREIGN PATENT DOCUMENTS 63-6516  1/1988  Japan .

Primary Examiner—Robert J. Pascal
Attorney, Agent, or Firm—Hill, Van Santen, Steadman & Simpson

[57] ABSTRACT

A frequency and/or phase characteristic control circuit comprising a current multiplier and an operational amplifier, the current multiplier containing a pair of diode junctions and a transistor arrangement for differential amplification, the operation amplifier having a capacitor connected to the out-of-phase input terminal thereof. The multiplying ratio of the current multiplier is varied so as to control the frequency and/or phase characteristic. This makes the circuit conducive to being implemented in an IC (integrated circuit). This circuit is particularly suitable for use as a circuit that switches the servo circuits of a laser disc player and a compact disc player.

6 Claims, 4 Drawing Sheets

FIG. I
(PRIOR ART)

FREQUENCY AND/OR PHASE CHARACTERISTIC CONTROL CIRCUIT HAVING CONTROLLED CURRENT MULTIPLYING RATIO

BACKGROUND OF THE INVENTION

The present invention generally relates to a frequency and/or phase characteristic control circuit. More particularly, the invention relates to a frequency and/or phase characteristic control circuit conducive to being formed in an IC (integrated circuit) for the phase compensation of servo circuits in applications such as optical disc recording and reproducing apparatus.

In Japanese Laid-open Utility Model No. 63-6516 there is disclosed a phase compensation circuit that includes a switching circuit for selecting a time constant. FIG. 1 of the present application is a reproduction of such circuit and illustrates a circuit diagram of a typical frequency and/or phase characteristic control circuit wherein a signal is fed from a photo detector 1 to a focus error amplifier 3 via current/voltage converters 2. The signal is then applied to an in-phase input terminal of an operational amplifier 4. From there, the signal is sent to a voltage/current converter 5 which in turn drives a focus coil 6.

As illustrated, coupled to another input of the operative amplifier 4 are two selectable time constant establishing branches 4a and 4b. Branch 4a comprises serially coupled reactor $R_1$ and capacitor $C_1$. Branch 4b comprises serially coupled resistor $R_2$ and capacitor $C_2$. These time constant branches are selected in accordance with the application of a control signal at a control terminal $C_1$. Inverters $IV_3$ and $IV_1$ and $IV_2$ are operatively disposed between the control terminal CT and the branches 4a and 4b, respectively, to provide for such selection.

One disadvantage of this prior art phase compensation circuit is its inability to be readily formed in an IC. This is because the time constant capacitor $C_1$ or $C_2$ needs to have a capacity of about 0.1 $\mu F$ when the responsive frequency is to be switched between 1 KHz (e.g., for a compact disc player) and 2 KHz (e.g., for a laser disc player).

SUMMARY OF THE INVENTION

The present invention overcomes the above-described drawbacks and disadvantages and provides a frequency and/or phase characteristic control circuit wherein the frequency characteristic is stabilized against temperature fluctuations.

Further, the present invention provides a frequency and/or phase characteristic control circuit wherein the capacitance of a capacitor interposed between the output terminal of a current multiplier and the out-of-phase input terminal of an operational amplifier is equivalent to a multiplying ratio M of the current multiplier, thereby making the capacitance of the actual capacitor small enough so that the frequency and/or phase characteristic control circuit can readily be implemented in an IC.

Yet further, the present invention provides a frequency and/or phase characteristic control circuit in an IC where the resistance value of the load resistor for the current multiplier is made variable, thereby minimizing temperature-induced changes in frequency or phase characteristic.

To these ends, the present invention provides in one embodiment a frequency and/or phase characteristic control circuit comprising: (1) a current multiplier having a multiplying ratio and containing an input terminal to be supplied with an input voltage, a voltage/current converter supplied with the input voltage so as to produce a pair of current signals at an output thereof, a pair of diode junctions supplied with the pair of current signals, a differential amplifier having first and second transistors and a current source, the first and second transistors being supplied with the voltage across the pair of diode junctions to produce a multiplied output current, and an output terminal connected to the output of the differential amplifier so as to produce output voltage across a load resistor proportional to the multiplied output current; (b) an operational amplifier having an in-phase input terminal, an out-of-phase input terminal and an output terminal; (c) a capacitor connected between the output terminal of the current multiplier and the out-of-phase input terminal of the operational amplifier; (d) a first impedance connected between the input terminal of the current multiplier and the out-of-phase input terminal of the operational amplifier; (e) a second impedance connected between the out-of-phase input terminal and the output terminal of the operational amplifier; wherein the frequency and/or phase of the output signal of the operational amplifier is controlled by varying the multiplying ratio of the current multiplier.

These and other features of the invention will become more apparent with reference to the following detailed description of the presently preferred embodiment and accompanying drawings.

DESCRIPTION OF THE PRESENTLY PREFERRED EMBODIMENTS

Preferred embodiments of the present invention will now be described with reference to FIGS. 2-6.

Figure 1:
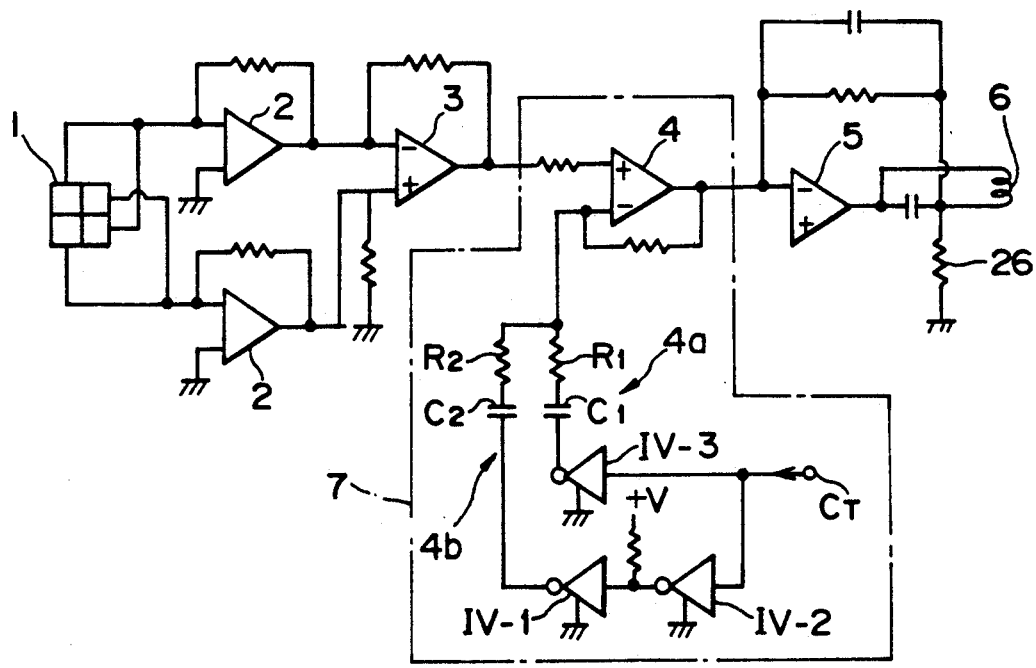
FIG. 1 is a circuit diagram of a typical prior art frequency and/or phase characteristic control circuit.
Figure 2:
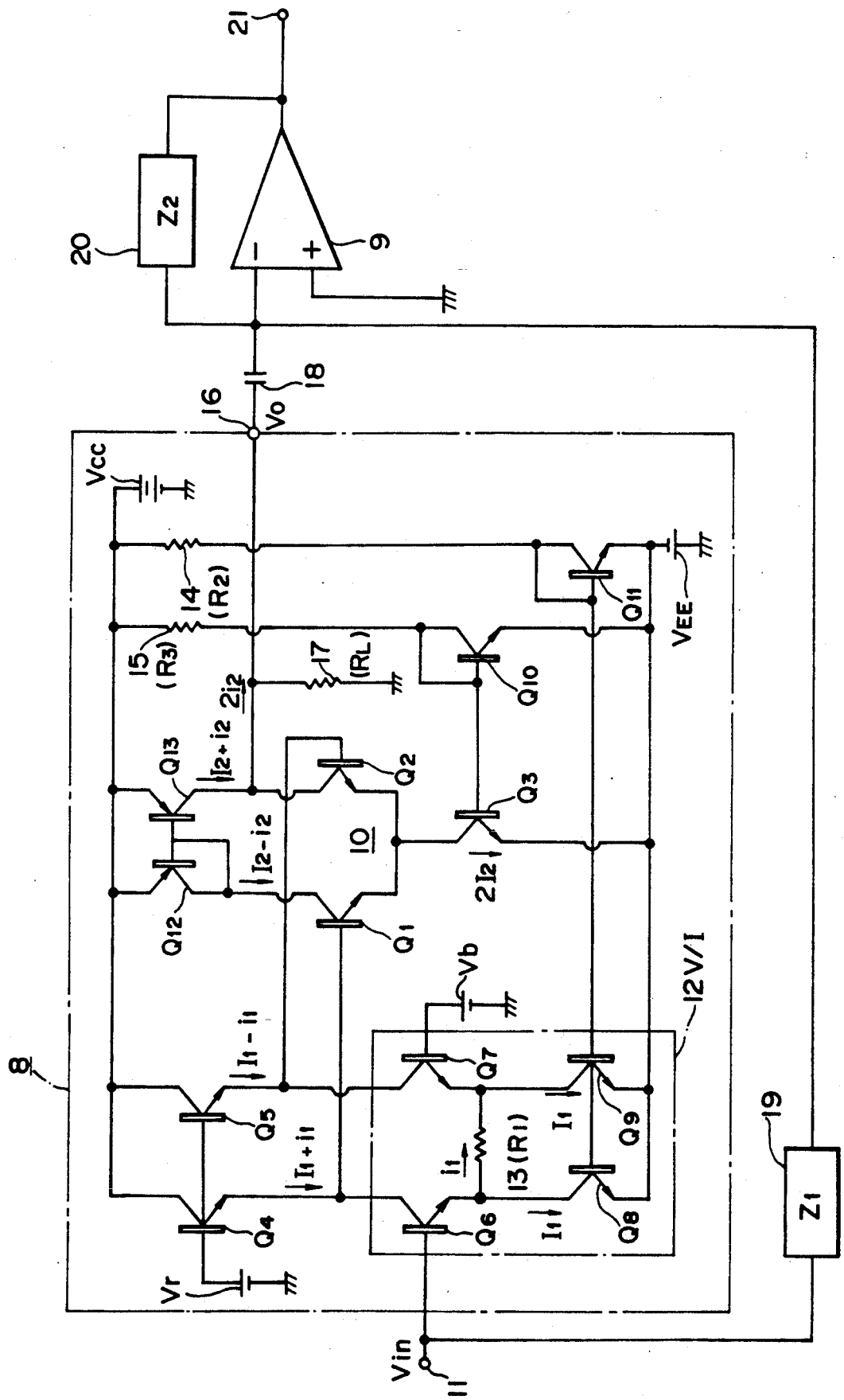
FIG. 2 is a circuit diagram of a frequency and/or phase characteristic control circuit embodying the present invention.

FIG. 2 is a circuit diagram of a first frequency and/or phase characteristic control circuit embodying the invention. In FIG. 2, reference numeral 8 identifies a current multiplier, and numeral 9 identifies an operational amplifier. The current multiplier 8 comprises: a differential amplifier 10 having a pair of transistors $Q_1$ and $Q_2$ and a constant current supply transistor $Q_3$; a pair of transistors $Q_4$ and $Q_5$ interposed as a pair of diode junctions between each base of the pair of transistors $Q_1$ and $Q_2$ on the one hand and a reference voltage supply $V_r$ on the other hand, the bases of the transistors $Q_4$ and $Q_5$ being interconnected; and a V/I converter 12 for converting an input voltage $V_i$ supplied to an input terminal 11 into an input current $I_1$. The V/I converter 12 comprises transistors $Q_6$ and $Q_7$. The transistor $Q_6$ has its base and collector connected respectively to the input terminal 11 and to the emitter of the transistor $Q_4$.

The transistor $Q_7$ has its base and collector connected respectively to a bias voltage supply $V_b$ and to the emitter of the transistor $Q_5$. The emitters of the transistors $Q_6$ and $Q_7$ are interconnected through a resistor 13 having a resistance value of $R_1$. These emitters are also connected to the collectors of the transistors $Q_8$ and $Q_9$ whose emitters are connected to a reference potential point (i.e., ground). Two equivalent bias currents $I_1$ flowing through the transistors $Q_8$ and $Q_9$ are supplied to the emitters of the transistors $Q_4$ and $Q_5$ via the collector emitter circuit of the transistor $Q_6$ and $Q_7$.

The base and emitter of the constant current supply transistor $Q_3$ are connected in parallel with the base and emitter of a diode connected transistor $Q_{10}$ to constitute a current mirror circuit. The base and emitter of the transistors $Q_8$ and $Q_9$ are connected in parallel with the base and emitter of a diode connected transistor $Q_{11}$ thereby to constitute a current mirror circuit. The collector of the transistor $Q_{11}$ is connected to a voltage supply $V_{cc}$ via a resistor 14 having a resistance value of $R_2$. The collector of the transistor $Q_{10}$ is also connected to the voltage supply $V_{cc}$ via a resistor 15 having a resistance value of $R_3$. A current $2I_2$ flowing through the constant current supply transistor $Q_3$ of the differential amplifier 10 branches out to the transistors $Q_1$ and $Q_2$. This causes a current $I_2$ to be supplied to transistors $Q_{12}$ and $Q_{13}$ which are connected to the collectors of the transistors $Q_1$ and $Q_2$ to another current mirror circuit. A common connection point of the collectors of the transistors $Q_{13}$ and $Q_2$ is connected to an output terminal 16.

The collectors of the transistors $Q_1$ and $Q_2$ in the differential amplifier 10 are supplied with an output current $i_2$ (wherein, $i_2 = i_1 \cdot I_2/I_1$). This output current $i_2$ is obtained by multiplying the input current $i_1$ by the ratio of half of the current $2I_2$ flowing between the collector and emitter of the constant current supply transistor $Q_3$ to the bias current $I_1$ flowing between the collector and emitter of the transistors $Q_4$ and $Q_5$. From the above current flow, a current $2i_2$ is obtained by a push-pull connection. The output current $2I_2$ generates an output voltage $V_0$ at a load resistor which has a resistance value of $R_L$ and is connected to the output terminal 16, the output voltage $V_0$ being proportional to the output current $i_2$.

A capacitor 18 having a capacitance of C is connected between the output terminal 16 of the current multiplier 8 and the out-of-phase input terminal (negative) of the operational amplifier 9. A first impedance element 19 having an impedance value of $Z_1$ is connected between the input terminal 11 of the current multiplier 8 and the out-of-phase input terminal (negative) of the operational amplifier 9. A second impedance element 20 having an impedance value of $Z_2$ is connected between the out-of-phase input terminal (negative) and output terminal 21 of the operational amplifier 9.

In operation, when the two transistors $Q_1$ and $Q_2$ in the differential amplifier 10 have the same characteristic as the transistors $Q_4$ and $Q_5$ whose base and emitter circuit constitute a pair of diode junctions, the sum of a voltage $V_{BE4}$ between the base and emitter of the transistor $Q_4$ and a voltage $V_{VBE1}$ between the base and emitter of the transistor $Q_1$ becomes equal to the sum of a voltage $V_{BE5}$ between the base and emitter of the transistor $Q_5$ and a voltage $V_{BE2}$ between the base and emitter of the transistor $Q_2$. Thus, the following equation is obtained:

$$V_{BE4} + V_{BE1} - V_{BE5} - V_{BE2} = 0 \quad (1)$$

Meanwhile, each emitter-to-base voltage can be expressed as follows:

$$V_{BE4} = \frac{KT}{q} \ln \frac{I_1 + i_1}{i_s} \quad (2)$$

$$V_{BE1} = \frac{KT}{q} \ln \frac{I_2 - i_2}{i_s} \quad (3)$$

$$V_{BE5} = \frac{KT}{q} \ln \frac{I_1 - i_1}{i_s} \quad (4)$$

$$V_{BE2} = \frac{KT}{q} \ln \frac{I_1 + i_2}{i_s} \quad (5)$$

where, q stands for the electric charge of an electron, K for Boltzmann's constant, T for the absolute temperature, and $i_S$ for the reverse saturation current. It is assumed that the current $I_S$ of each transistor is the same.

By substituting equations (2) through (5) in equation (1), one obtains the following equation $$i_2 = \frac{I_2}{I_1} \cdot i_1 \quad (6)$$

If the resistance value $R_1$ of the resistor 13 is sufficiently larger than the emitter resistance ($26\Omega/1$ mA), then $$i_1 = \frac{V_{in}}{R_1}$$

Thus, the output voltage $V_0$ of the current multiplier 8 is given by the equation $$\begin{aligned} V_0 &= 2 i_2 \cdot R_L \quad (7) \\ &= \frac{V_{in}}{R_1} \cdot \frac{V_{CC}}{R_3} \cdot \frac{R_2}{V_{CC}} \cdot R_L \\ &= \frac{V_{in}}{R_1} \cdot \frac{R_2}{R_3} \cdot R_L \\ &= M V_{in} \end{aligned}$$

where, a multiplying ratio of $$M = \frac{R_2 \cdot R_L}{R_1 \cdot R_3}$$

A transfer function $G_{(S)}$ across the input terminal 11 to the output terminal 21 is obtained using the equation $$G_{(s)} = \frac{Z_2}{Z_1} (1 + S M C Z_1) \quad (8)$$

Therefore, the frequency characteristic is controlled by varying the multiplying ratio M of the current multiplier 8.

As is evident from equation (8), $MCZ_1$ indicates that the time constant apparently is given as if multiplied by M. This reduces the required capacitance of the capacitor 18, which makes it easier to form the circuit in an IC.

If the resistor 14 having the resistance value $R_2$ is externally installed, the resistance ratio inside the IC becomes:

$$\frac{Z_1 \cdot R_L}{R_1 \cdot R_3}$$

This keeps the frequency characteristic stabilized against temperature fluctuations.

Figure 3:
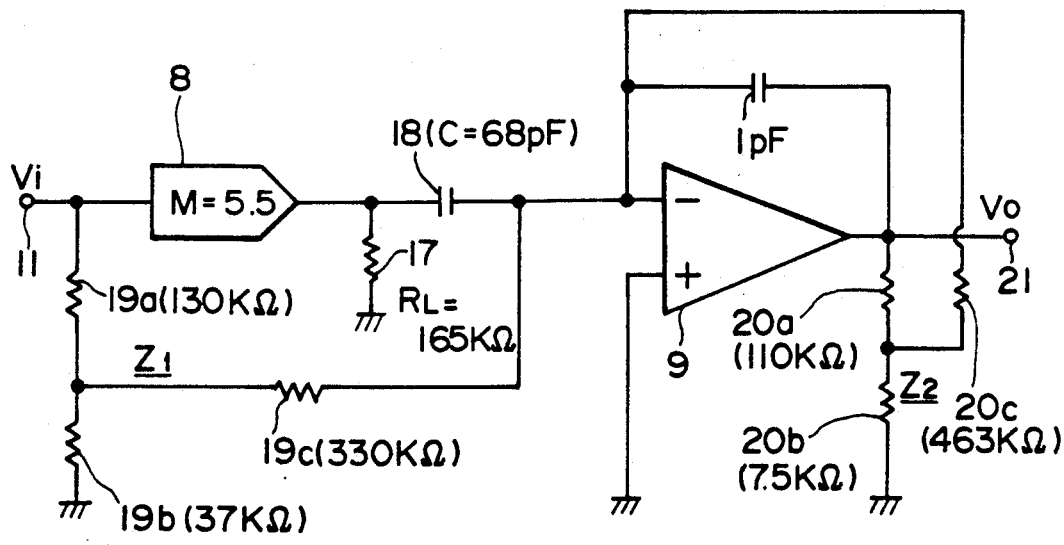
FIG. 3 is a variation of the circuit diagram of the embodiment of FIG. 2.

Referring now to FIG. 3, in one embodiment, the multiplying ratio M of the current multiplier 8 is set to 5.5. The first impedance element 19 comprises attenuation resistors 19a (130 KΩ) and 19b (37 KΩ) and a feedback resistor 19c (330 KΩ). The second impedance element 20 comprises attenuation resistors 20a (110 KΩ) and 20b (7.5 KΩ), a feedback resistor 20c (463 KΩ) and a capacitor (1 pF) for preventing oscillation. The capacitor 18 has a capacitance (c) of 68 pF, and the load resistor 17 has a resistance ($R_L$) of 165 KΩ. In this embodiment, one obtains the following relationships:

$$r_1 = \frac{R_L}{M} = \frac{165}{5.5} = 30 \text{ K}\Omega$$

$$C_0 = CM = 5.5 \times 68 \text{ pF} = 374 \text{ pF}$$

$$r_2 = \frac{130 \times 37 + 37 \times 330 + 330 \times 130}{37} = 1.62 \text{ M}\Omega$$

$$r_3 = \frac{110 \times 7.5 + 7.5 \times 463 + 463 \times 110}{7.5} = 7.3 \text{ M}\Omega$$

The frequency characteristic of the equivalent circuit in FIG. 3 has an inflection point at $$f_1 = \frac{1}{2\pi C_0(r_1 + r_2)} = 258 \text{ Hz}$$

and at $$f_2 = \frac{1}{2\pi C_0 r_1} = 14 \text{ KHz}$$

Figure 5A:
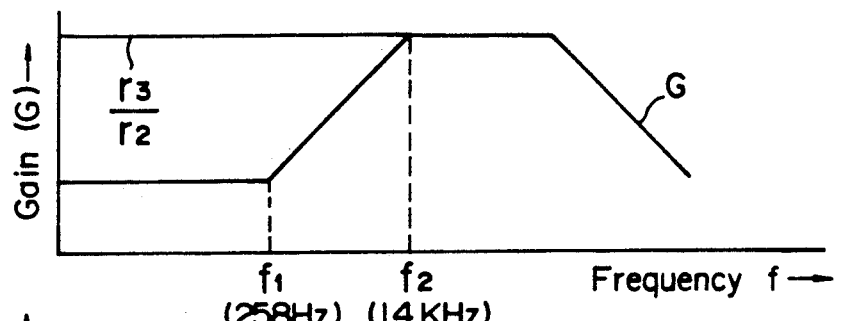
FIGS. 5A and 5B are a gain characteristic chart and a phase characteristic chart, respectively, for use in describing the invention.
Figure 5B:
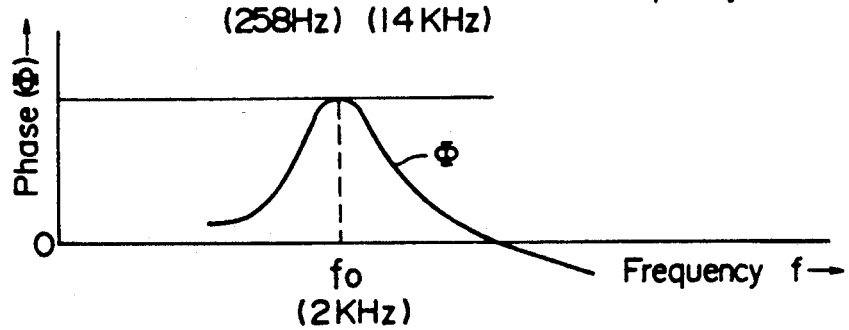

This is indicated by character G in FIG. 5 (A).

Figure 4:
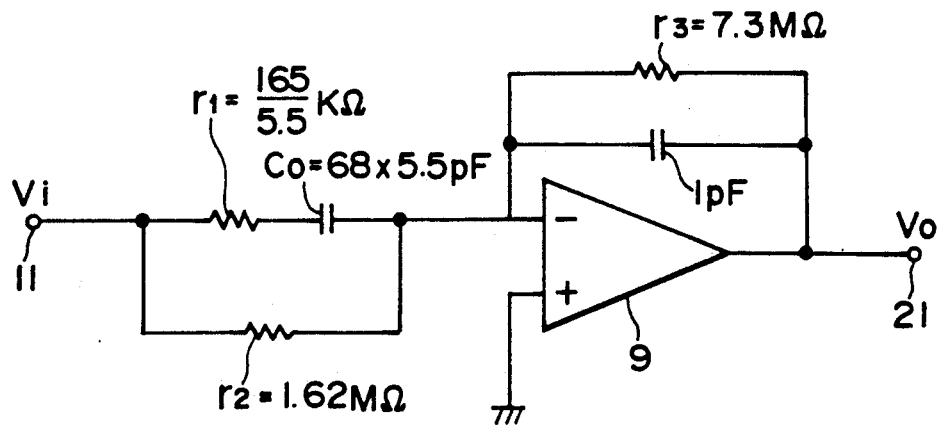
FIG. 4 is another equivalent circuit diagram of the circuit diagram of the embodiment of FIG. 2.

The equivalent circuit is illustrated in FIG. 4.

The peak frequency $f_0$ of the phase characteristic is obtained using the following equation:

$$f_0 = \sqrt{f_1 + f_2} = \sqrt{258 \times 14000}$$

as depicted in FIG. 5 (B) in which a peak Φ is observed at around 2 KHz.

In the equation providing the multiplying factor M for the current multiplier 8, $$M = \frac{R_2 \cdot R_L}{R_1 \cdot R_3}$$

the resistance value $R_L$ of the load resistor 17 is multiplied by 1/n so as to turn $f_1$ into $nf_1$, $f_2$ into $nf_2$, and $f_0$ into $$\sqrt{nf_1 \cdot nf_2} = n\sqrt{f_1 \cdot f_2}$$

Thus, the frequency and phase characteristic is varied as desired. For example, if n=½, then $f_0$ is set at approximately for 1 kHz. The load resistor 17 preferably comprises an electronic switch that controls a plurality of resistors using a control signal external to the IC. That is, the resistance value $R_L$ may alternatively be varied by operating the electronic switch.

As described, the frequency and/or phase characteristic control circuit according to the invention is a circuit wherein the capacitance of the capacitor interposed between the output terminal of the current multiplier and the out-of-phase input terminal of the operational amplifier is multiplied by the multiplying ratio M of the current multiplier. This means that the actual capacitance of the capacitor is small enough to permit the circuit to be readily formed in an IC.

Where the resistance value of the load resistor arrangement in the current multiplier is varied in a frequency and/or phase characteristic control circuit formed in an IC, temperature-induced fluctuations in the frequency or phase characteristic are significantly reduced.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A frequency and/or phase characteristic control circuit comprising:

(a) a current multiplier having a multiplying ratio and containing an input terminal to be supplied with an input voltage, a voltage/current converter supplied with said input voltage so as to produce a pair of current signals at the output thereof, a pair of diode junctions supplied with said pair of current signals, a differential amplifier having first and second transistors and a current source, said first and second transistors being supplied with the voltage across said pair of diode junctions to produce a multiplied output current, and an output terminal connected to the output of said differential amplifier so as to produce output voltage across a load resistor proportional to said multiplied output current;

(b) an operational amplifier having an in-phase input terminal, an out-of-phase input terminal and an output terminal;

(c) a capacitor connected between the output terminal of said current multiplier and the out-of-phase input terminal of said operational amplifier;

(d) a first impedance connected between the input terminal of said current multiplier and the out-of-phase input terminal of said operational amplifier; and (e) a second impedance connected between the out-of-phase input terminal and the output terminal of said operational amplifier; wherein the frequency and/or phase of the output signal of said operational amplifier is controlled by varying the multiplying ratio of said current multiplier.

2. A frequency and/or phase characteristic control circuit according to claim 1, wherein the multiplying ratio of said current multiplier is controlled by varying the resistance of said load resistor.

3. A frequency and/or phase characteristic control circuit according to claim 1, wherein the multiplying ratio of said current-multiplier is controlled by varying the current ratio of said voltage/current converter and said differential amplifier.

4. A frequency and/or phase characteristic control circuit according to claim 1, wherein said input voltage of said current multiplier is a servo signal and the output signal of said operational amplifier is used for driving a focus coil.

5. A frequency and/or phase characteristic control circuit according to claim 4, wherein said frequency and/or phase characteristic of said operational amplifier is controlled by varying the resistance of said load resistor in response to a signal generated by a device such as a laser disc player or a compact disc player.

6. A frequency and/or phase characteristic control circuit according to claim 4, wherein said current multiplier and said operational amplifier are formed in a single-chip integrated circuit.

* * * * *